(12) United States Patent
Harris et al.

(10) Patent No.: US 7,541,238 B2
(45) Date of Patent: Jun. 2, 2009

(54) INDUCTOR FORMED IN AN INTEGRATED CIRCUIT

(75) Inventors: Edward Belden Harris, Fogelsville, PA (US); Sailesh Mansinh Merchant, Macungie, PA (US); Kurt George Steiner, Fogelsville, PA (US); Susan Clay Vitkavage, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 191 days.

(21) Appl. No.: 11/414,902

(22) Filed: May 1, 2006

(65) Prior Publication Data

US 2006/0192647 A1 Aug. 31, 2006

Related U.S. Application Data

(62) Division of application No. 10/953,475, filed on Sep. 29, 2004, now Pat. No. 7,068,139.

(60) Provisional application No. 60/507,335, filed on Sep. 30, 2003.

(51) Int. Cl.
*H01L 21/8238* (2006.01)
(52) U.S. Cl. ...................................... 438/210; 336/200
(58) Field of Classification Search ................ 336/65, 336/83, 200, 206–208, 232; 257/531; 438/210, 438/706–724
See application file for complete search history.

(56) References Cited

U.S. PATENT DOCUMENTS

| | | | |
|---|---|---|---|
| 5,446,311 A * | 8/1995 | Ewen et al. ................ 257/531 |
| 5,610,433 A | 3/1997 | Merrill et al. | |
| 6,002,161 A | 12/1999 | Yamazaki | |
| 6,008,102 A | 12/1999 | Alford et al. | |
| 6,031,445 A | 2/2000 | Marty et al. | |
| 6,037,649 A | 3/2000 | Liou | |
| 6,054,329 A | 4/2000 | Burghartz et al. | |
| 6,083,802 A * | 7/2000 | Wen et al. ................... 438/381 |
| 6,114,937 A | 9/2000 | Bughartz et al. | |
| 6,329,234 B1 | 12/2001 | Ma et al. | |
| 6,342,424 B1 | 1/2002 | Pichler | |
| 6,395,637 B1 * | 5/2002 | Park et al. .................. 438/706 |
| 6,429,504 B1 | 8/2002 | Beaussart et al. | |
| 6,472,285 B1 | 10/2002 | Liou | |
| 6,504,227 B1 * | 1/2003 | Matsuo et al. .............. 257/531 |
| 6,573,148 B1 | 6/2003 | Bothra | |
| 6,650,220 B2 * | 11/2003 | Sia et al. ..................... 336/200 |
| 6,830,984 B2 | 12/2004 | Schultz et al. | |
| 6,847,066 B2 * | 1/2005 | Tahara et al. ................ 257/243 |
| 7,068,139 B2 | 6/2006 | Harris et al. | |

\* cited by examiner

*Primary Examiner*—Tuyen T. Nguyen

(57) ABSTRACT

An inductor formed within an integrated circuit and a method for forming the inductor. The inductor comprises an underlying layer of aluminum formed in a first metallization layer and patterned and etched into the desired shape. In one embodiment the aluminum line comprises a spiral shape. According to a damascene process, a conductive runner, preferably of copper, is formed in a dielectric layer overlying the aluminum line and in electrical contact therewith. The aluminum line and the conductive runner cooperate to form the inductor. In another embodiment the aluminum line and the conductive runner are formed in a vertically spaced-apart orientation, with tungsten plugs or conductive vias formed to provide electrical connection therebetween. A method for forming the inductor comprises forming an aluminum conductive line and forming a conductive runner over the conductive line.

10 Claims, 12 Drawing Sheets

INDUCTOR FORMED IN AN INTEGRATED CIRCUIT

This patent application is a divisional of Ser. No. 10/953,475, filed on Sep. 29, 2004, now U.S. Pat. No. 7,068,139, which claims the benefit of the provisional patent application filed on Sep. 30, 2003, and assigned application No. 60/507,335.

FIELD OF THE INVENTION

This invention relates generally to inductors, and more specifically, to spiral inductors formed in a semiconductor substrate.

BACKGROUND OF THE INVENTION

The current revolution in wireless communications and the need for smaller wireless communications devices has spawned significant efforts directed to the optimization and miniaturization of radio communications electronic devices. Passive components, such as inductors, capacitors and transformers, play a necessary role in the devices' operation and thus efforts have been directed toward reducing the size and improving the performance and fabrication efficiency of such components.

An inductor is an electromagnetic component employed in alternating current and radio frequency applications such as oscillators, amplifiers and signal filters, to provide frequency dependent effects. A discrete conventional inductor comprises a plurality of windings typically enclosing a core constructed of a magnetic material. Use of a magnetic core yields a higher inductance value, but is not necessarily required. The inductance is also a function of the number of coil turns (specifically, the inductance is proportional to the square of the number of turns) and the core area. Conventional discrete inductors are formed as a helix (also referred to as a solenoidal shape) or a torroid. The core is typically formed of a ferromagnetic material (e.g., iron, cobalt, nickel) having a plurality of magnetic domains. The application of a magnetic field to the core material when the inductor is energized causes domain alignment and a resulting increase in the material permeability, which in turn increases the inductance.

With the continued expansion of communications services into higher frequency bands, the inductors are required to operate at higher frequencies. But it is known that inductor losses increase as the operational frequency increases due to larger eddy currents and the skin effect. To avoid these losses at relatively low operational frequencies, the inductive effect can be simulated by certain active devices. But the active devices cannot provide acceptable inductive effects at higher frequencies, have a limited dynamic range and can inject additional unwanted noise into the operating circuits.

Forming inductors in semiconductor circuits can be problematic, especially as integrated circuit size shrinks to improve device performance. Compared with current device sizes and line widths, inductors and capacitors are large structures that consume valuable space on the semiconductor surface and are therefore not easily integrated into semiconductor devices. Ideally, the inductors should be formed on a relatively small surface area of a semiconductor substrate, using methods and procedures that are conventional in the semiconductor processing art. Further, the inductor must be operational at the high frequencies used in today's communications devices and exhibit limited power losses.

Typically, inductors formed on an integrated substrate surface have a spiral shape where the spiral is in a plane parallel to the substrate surface. Many techniques are known for forming the spiral inductor, such as by patterning and etching a conductive material formed on the substrate surface. Multiple interconnected spiral inductors can be formed to provide desired inductive properties and/or simplify the inductor fabrication process. See for example, U.S. Pat. No. 6,429,504 describing a multi-layer spiral inductor and U.S. Pat. No. 5,610,433 describing a plurality of spaced-apart stacked circular conductors interconnected by vias to form a plurality of spiral conductors.

Problems encountered when forming an inductor on the surface of a semiconductor substrate include self-resonance caused by a parasitic capacitance between the (spiral) inductor and the underlying substrate, and the consumption of excess power by the conductor forming the inductor and the inductor's parasitic resistance. Both of these effects can limit the high frequency performance of the inductor.

The Q (quality factor) of an inductor is a ratio of inductive reactance to resistance and is related to the inductor's bandwidth. High Q inductors (i.e., exhibiting a relatively low inductive resistance) present a narrow Q peak as a function of the input signal frequency, with the peak representing the inductor resonant frequency. High Q inductors are especially desirable for use in frequency-dependent circuits operating with narrow bandwidths. Because the Q value is an inverse function of inductor resistance, minimizing the resistance increases the Q.

One technique for minimizing the resistance increases the cross-sectional area of the conductive material forming the inductor. However, increasing the cross-sectional area increases the conductor aspect ratio (i.e., the ratio of the conductor height above a semiconductor substrate plane to the conductor width along the plane). Such high aspect ratio conductors formed on the semiconductor substrate can lead to difficulties in subsequent etching, cleaning, and passivating processes due to steps formed between an upper surface of the relatively thick conductor and an upper surface of the substrate. Such inductors also consume valuable space on the semiconductor substrate. Formation of high aspect ratio inductors can also promote dielectric gaps, which may lead to device failures, between the inductor's closely spaced conductive lines. Although there are known processes for attempting to fill these gaps, such processes are not always successful.

BRIEF SUMMARY OF THE INVENTION

One embodiment of the present invention comprises a method for forming an inductor in a semiconductor integrated circuit. The method comprises forming a conductive line in a metallization layer, forming a dielectric layer overlying the conductive line, forming a trench in the dielectric layer and forming a conductive runner in the trench, wherein the conductive runner is in conductive communication with the conductive line, and wherein the conductive line and the conductive runner cooperate to produce an inductive effect.

According to a structural embodiment of the present invention, an integrated circuit comprises an inductor formed therein. The integrated circuit comprises a substrate, a plurality of material layers overlying the substrate, a conductive line disposed in a first metallization layer and a conductive runner disposed in a second metallization layer above the first metallization layer and in substantially vertical alignment and physical contact with the conductive line, wherein the conductive line and the conductive runner cooperate to produce an inductive effect.

BRIEF DESCRIPTION OF THE DRAWINGS

The present invention can be more easily understood and the advantages and uses thereof more readily apparent, when the following detailed description of the present invention is read in conjunction with the figures wherein.

In accordance with common practice, the various described device features are not drawn to scale, but are drawn to emphasize specific features relevant to the invention. Reference characters denote like elements throughout the figures and text.

DETAILED DESCRIPTION OF THE INVENTION

Before describing in detail one exemplary process for forming an inductor and an inductor formed thereby according to the present invention, it should be observed that the invention resides in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

According to a first embodiment of the present invention, an aluminum interconnect layer, i.e., an $(n-1)^{th}$ interconnect layer of a semiconductor integrated circuit, is formed according to known process steps on a material layer 104 (see FIG. 1) over a substrate 100 comprising active regions and semiconductor devices. Generally, the $(n-1)^{th}$ layer also includes conductive lines formed by masking, patterning and etching of a conductive material for connecting device regions in the integrated circuit. An $n^{th}$ interconnect or metallization layer represents the uppermost interconnect layer of the integrated circuit.

Figure 1:
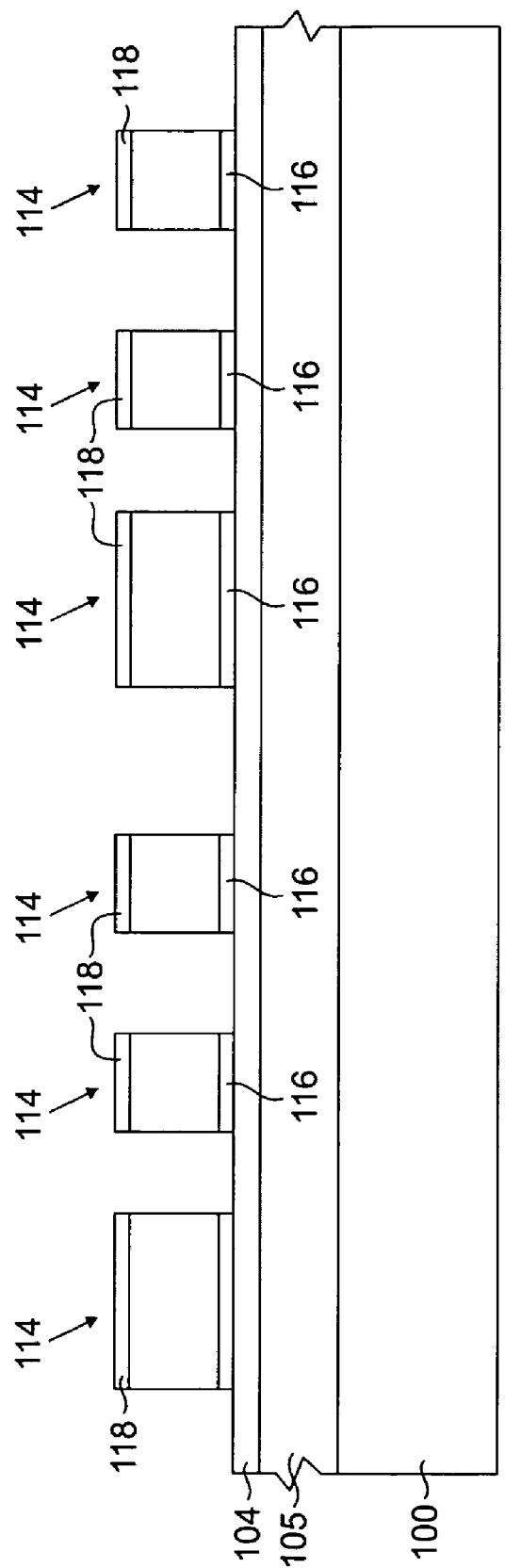
FIGS. 1-6 illustrate a semiconductor structure and inductor during sequential processing steps according to a first embodiment of the present invention.
Figure 2:
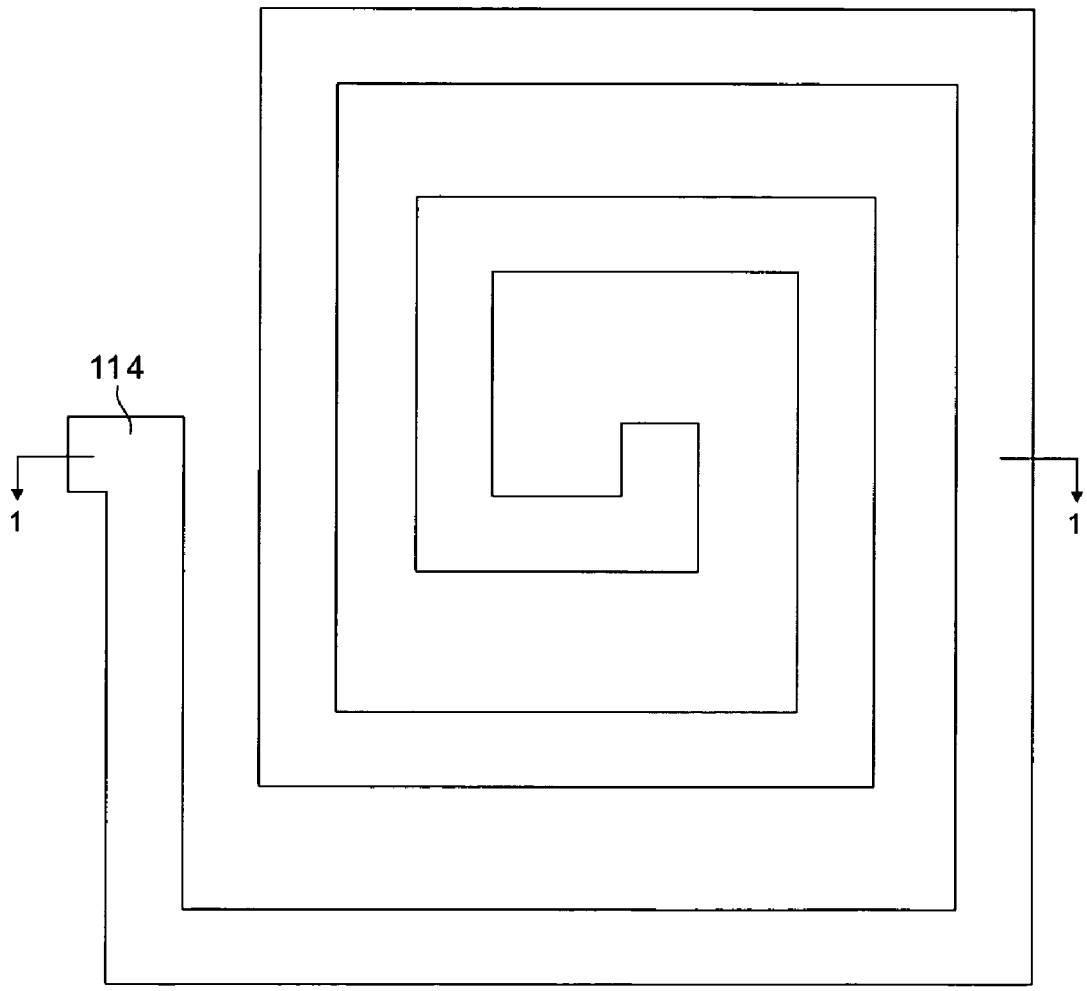

A reference character 105 in FIG. 1 indicates the existence of material layers between the substrate 100 and the material layer 104, including dielectric layers and interconnect layers as is well known in the art. According to this embodiment of the present invention, the aluminum layer formed on the material layer 104 is masked, patterned and etched to form a continuous generally spiral-shaped conductive line 114 shown in a cross-sectional view of FIG. 1 and a plan view of FIG. 2. An underlayer 116 and an overlayer 118 (each comprising, for example, titanium or titanium nitride) are also illustrated. The underlayer 116 and the overlayer 118 are conventional in the art.

Figure 3:
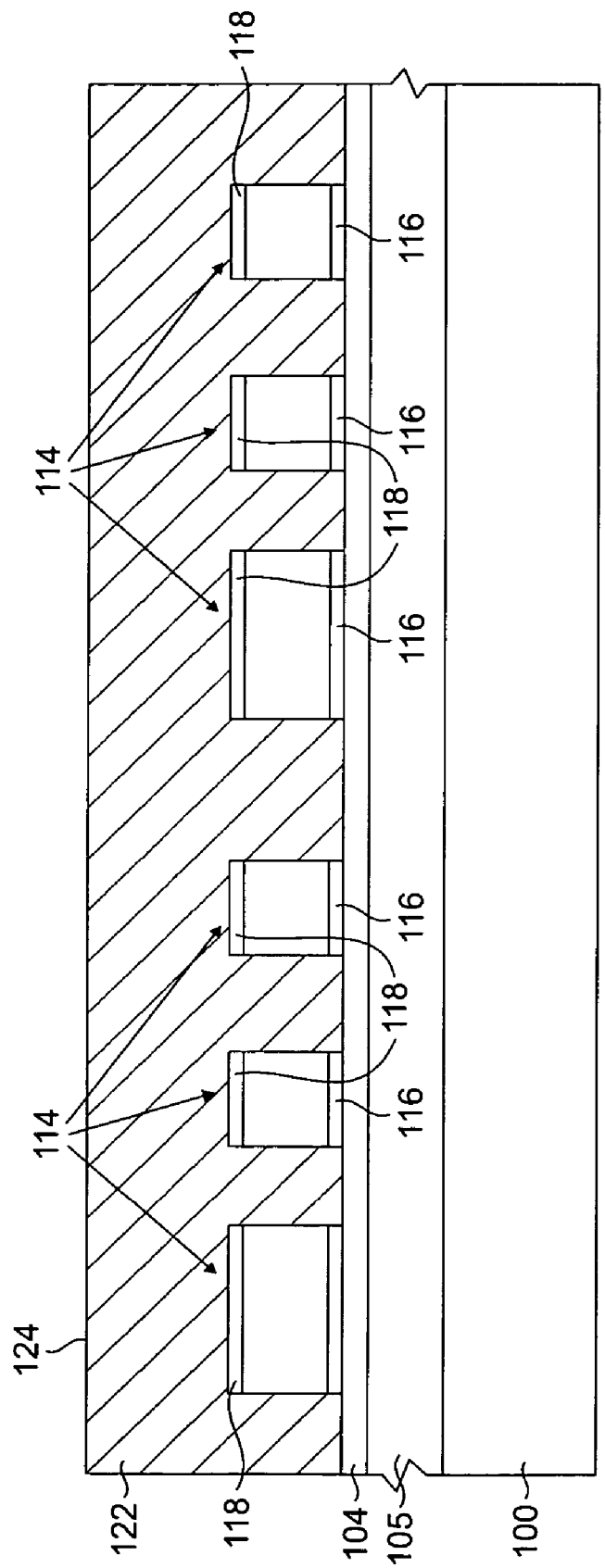

An interlayer dielectric 122 is formed over the conductive line 114, and a chemical/mechanical polishing process planarizes an upper surface 124 of the interlayer dielectric 122. The resulting structure is illustrated in FIG. 3.

Using conventional photolithographic masking, patterning and etching steps, a continuous generally spiral-shaped trench is formed in the interlayer dielectric 122 overlying the conductive line 114 and having the same general shape thereof. According to this embodiment, the trench is not formed over two regions 114A and 114B (see FIG. 4) of the conductive line 114.

As is conventional in the art, a barrier layer 126 (preferably of tantalum or tantalum nitride) and a seed layer (not shown) are formed in the trench and over the upper surface 124. The barrier layer 126 prevents copper diffusion into the interlayer dielectric 122. The seed layer promotes formation of copper within the trench. According to the known damascene process, copper is electroplated in the trench and overlying the upper surface 124.

Figure 4:
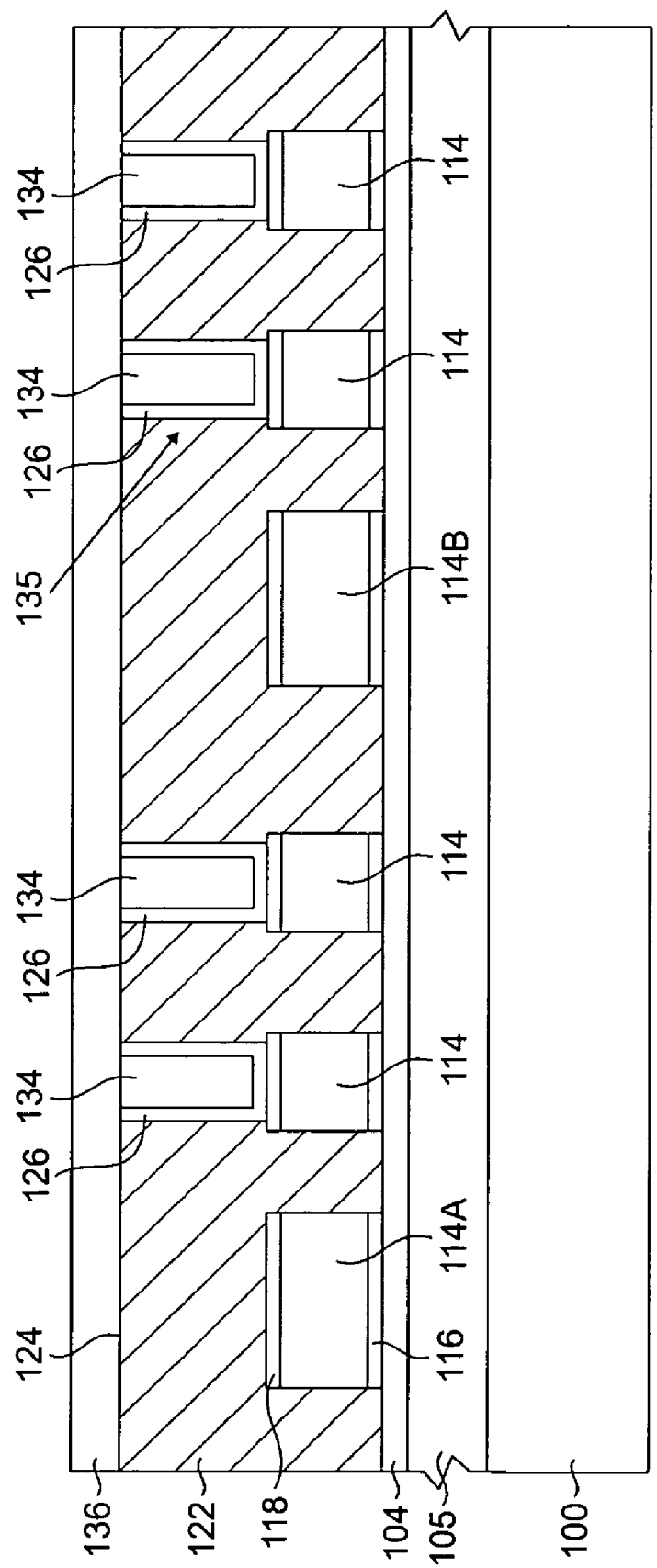

Chemical/mechanical polishing removes copper overfill and excess barrier/seed layer from the upper surface 124, leaving a continuous generally spiral-shaped conductor 134 in electrical communication with the underlying conductive line 114, thereby completing formation of a spiral inductor 135. A passivation layer 136 (to prevent copper surface diffusion during subsequent temperature exposures to the substrate 100) is formed overlying the spiral inductor 135 and the surrounding regions of the upper surface 124. The final structure is illustrated in FIG. 4, with the conductive line 114 disposed in the $(n-1)^{th}$ interconnect layer and the conductor 134 disposed in the $n^{th}$ layer.

Figure 5:
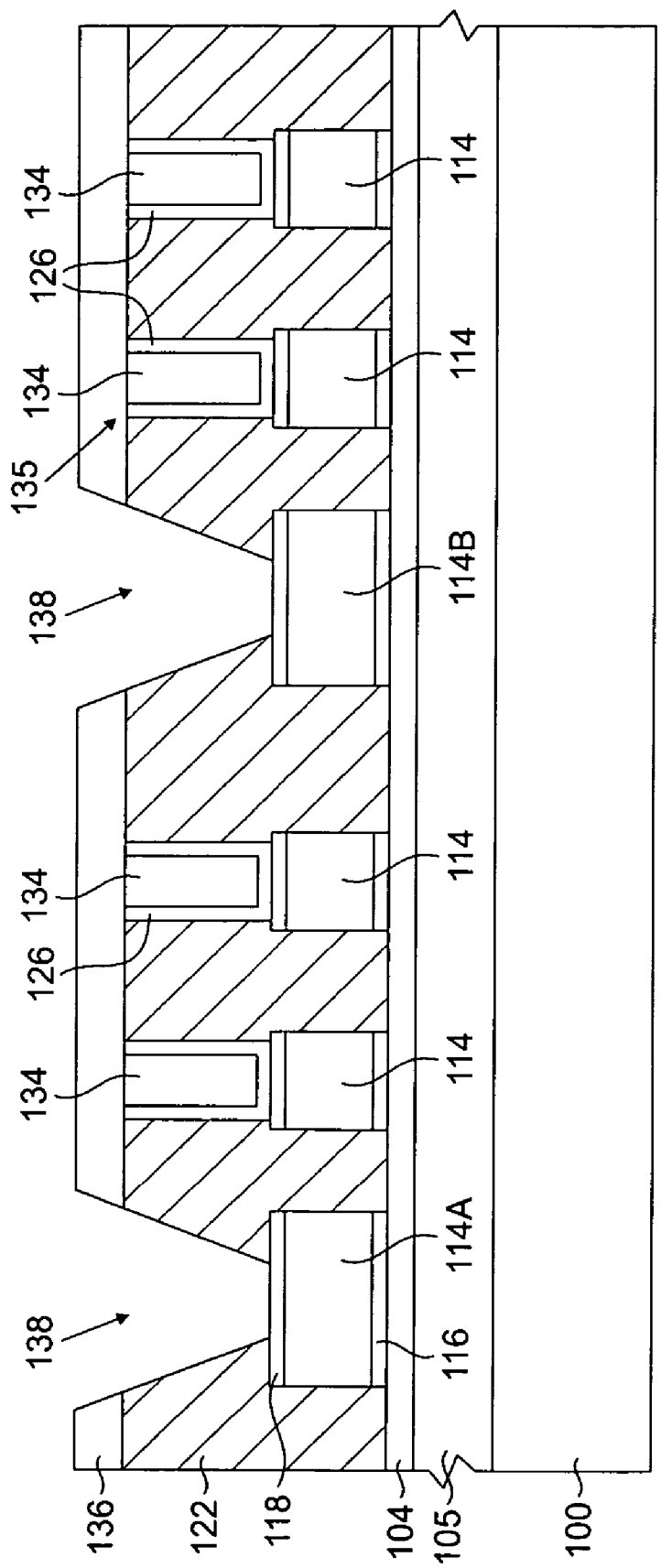
Figure 6:
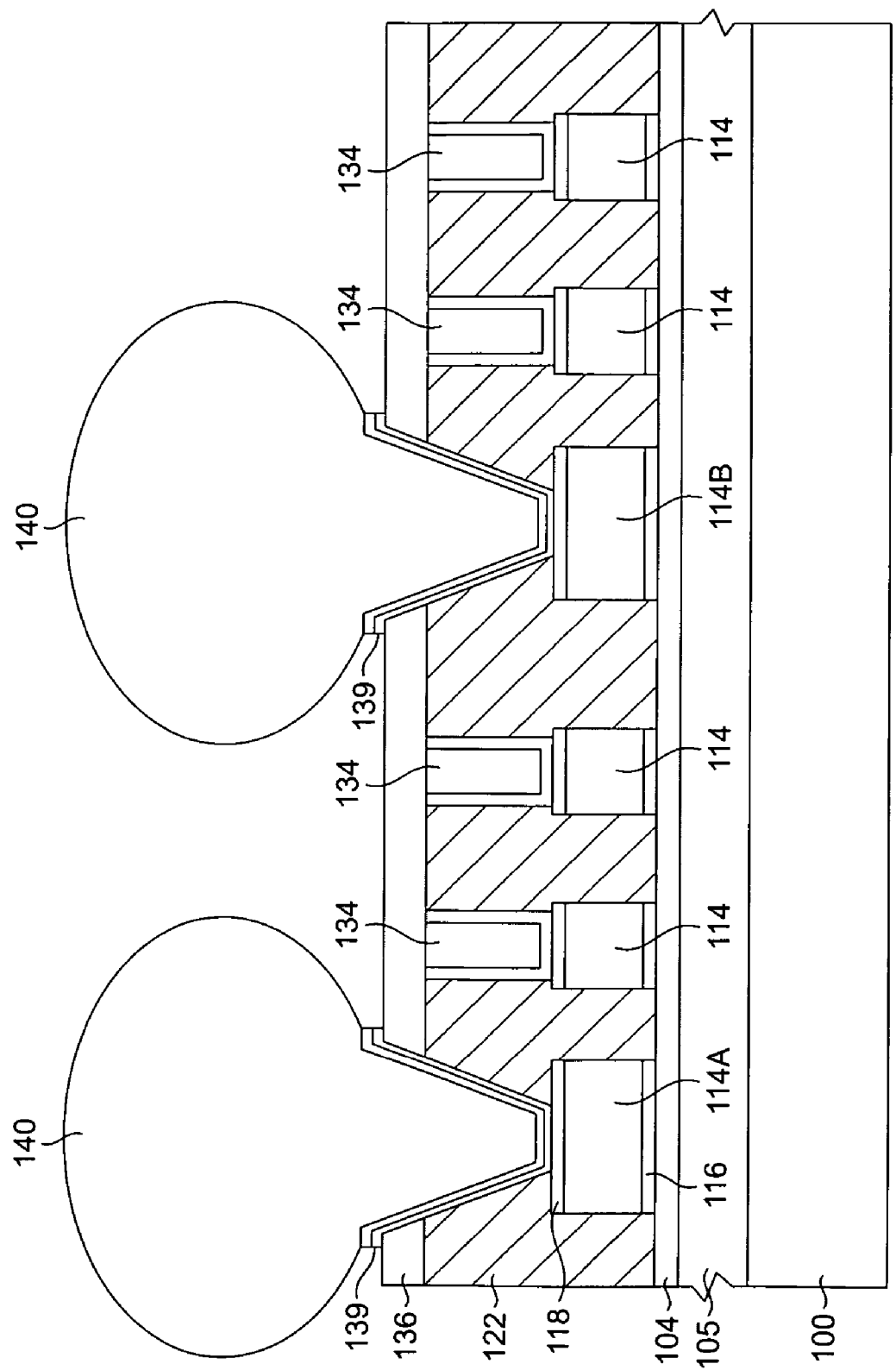

Conventional masking, patterning and etching steps are employed to form openings 138 to access the two regions 114A and 114B of the conductive line 114. See FIG. 5. Within the openings 138 conventional interconnect structures can be formed to provide external connections to the regions 114A and 114B, and thus the inductor 135. One such technique (e.g., bump bonding) for providing external connections to the regions 114A and 114B is illustrated in FIG. 6. It is known in the art that under-bump metallurgy layers and/or materials (designated by reference character 139) may be required above regions 114A and 114B to ensure adequate adhesion to a solder bump 140.

Those skilled in the art recognize that the openings 138 are formed to connect the substrate 100 to package leads of a package into which the substrate 100 is assembled. Any of the well known packaging and lead connection techniques can be employed in conjunction with the present invention, such as bump bonding, flip chip solder bonding wire bonding, etc.

Advantageously, the inductor 135 constructed as described above offers a lower resistance (and thus a higher Q factor) due to use of copper to form an upper layer (i.e., the conductor 134) of the inductor 135, as compared with inductors of the prior art.

Another embodiment of the present invention begins with formation of an $(n-1)^{th}$ aluminum metallization layer followed by masking, patterning and etching steps to form a conductive line in a generally spiral shape. These process steps are similar to those described above in conjunction with FIGS. 1 and 2, for forming the conductive line 114. After formation of the conductive line 114, and other interconnecting conductive lines in the $(n-1)^{th}$ metallization layer, the interlayer dielectric 122 is formed and planarized as illustrated in FIG. 3.

Figure 7:
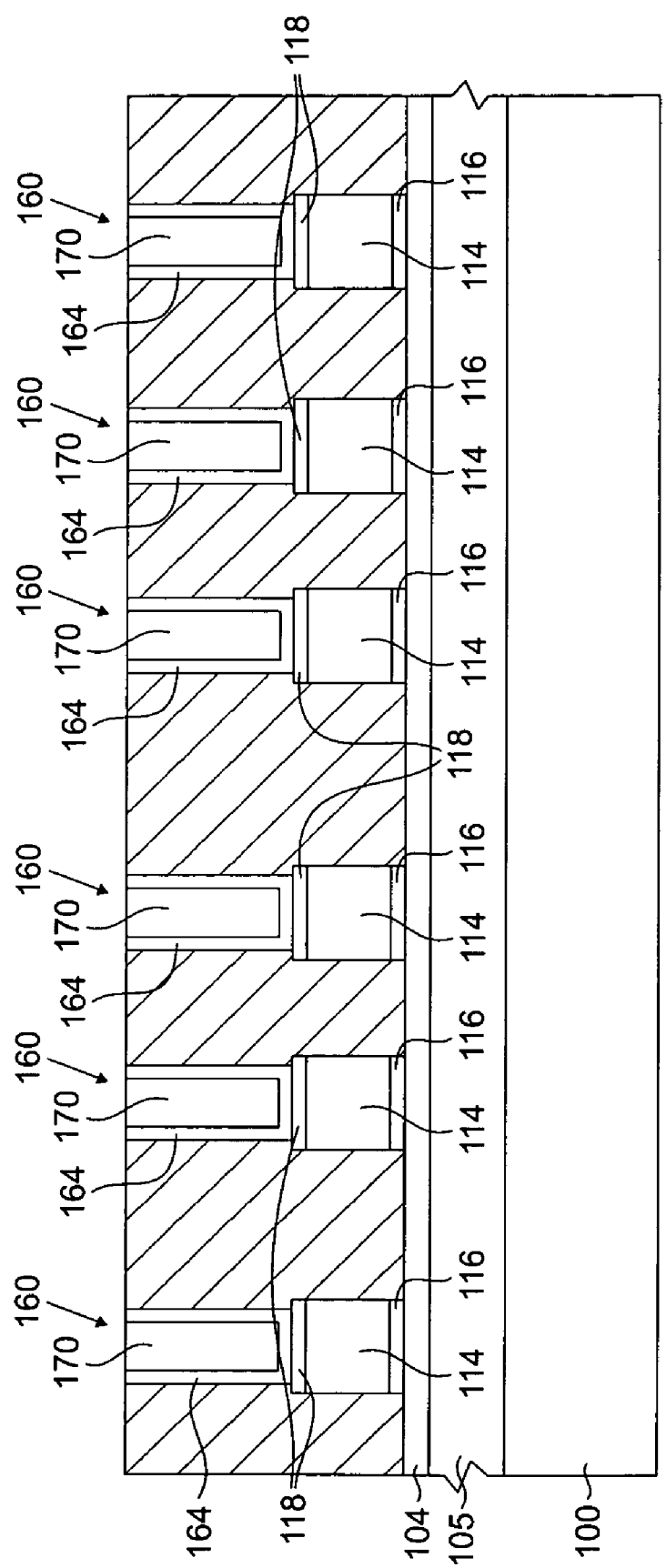
FIGS. 7-12 illustrate a semiconductor structure and inductor during sequential processing steps according to a second embodiment of the present invention.

The present embodiment begins with the formation of tungsten plugs 160 as illustrated in FIG. 7. The tungsten plugs 160, comprising a titanium layer/titanium-nitride layer 164 and tungsten 170, are formed in openings in the interlayer dielectric 122 according to known techniques.

Figure 8:
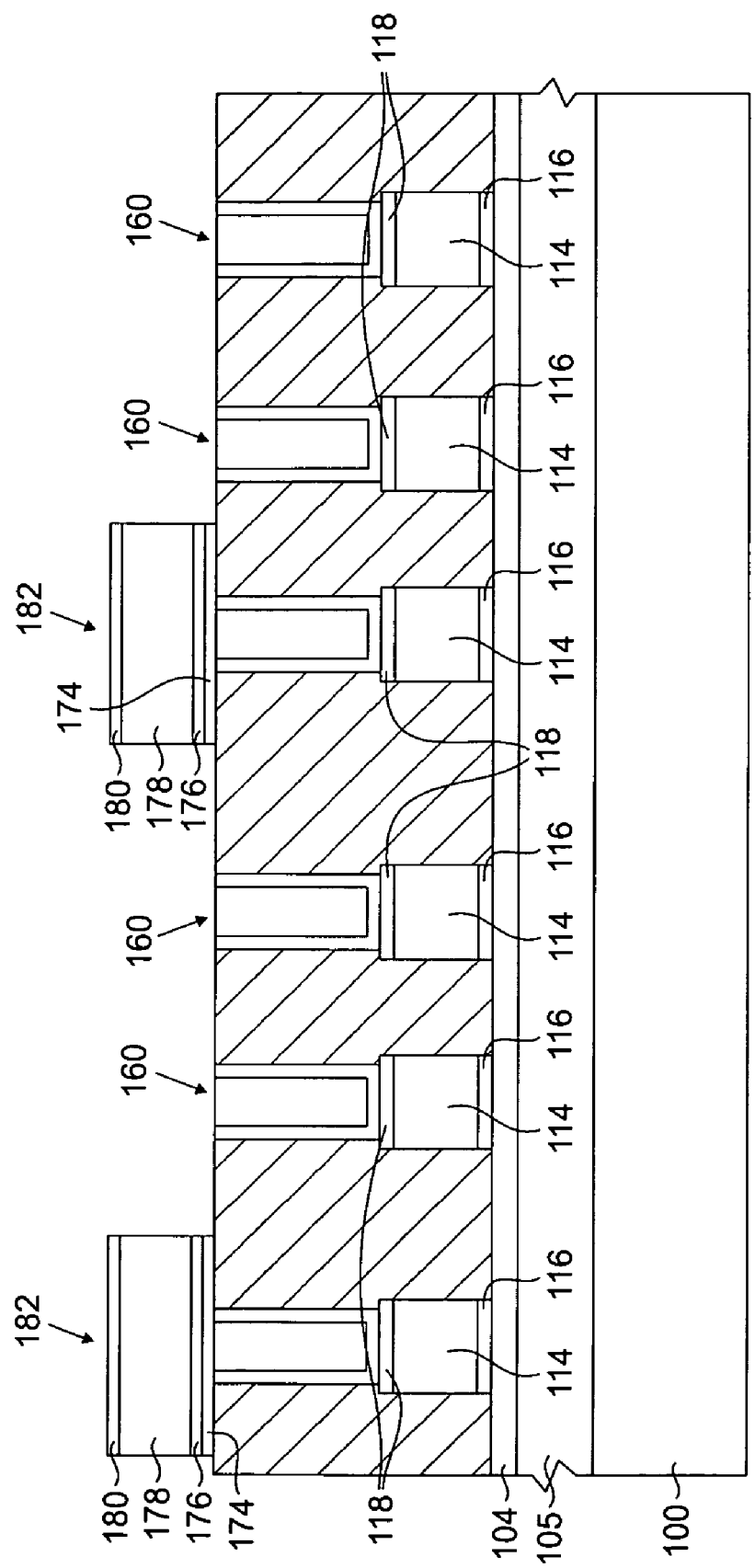

An aluminum stack (also referred to as the $n^{th}$ metallization layer) comprising, from bottom to top, a titanium layer 174, a titanium nitride layer 176, an aluminum layer 178 and an anti-reflective cap layer 180, is deposited and etched to form conductive pads 182 in FIG. 8. In other regions of the of the $n^{th}$ metallization layer the aluminum stack can be patterned to form $n^{th}$ layer metallization interconnect structures for connecting various device regions and other interconnect structures not associated with the inductor.

Figure 9:
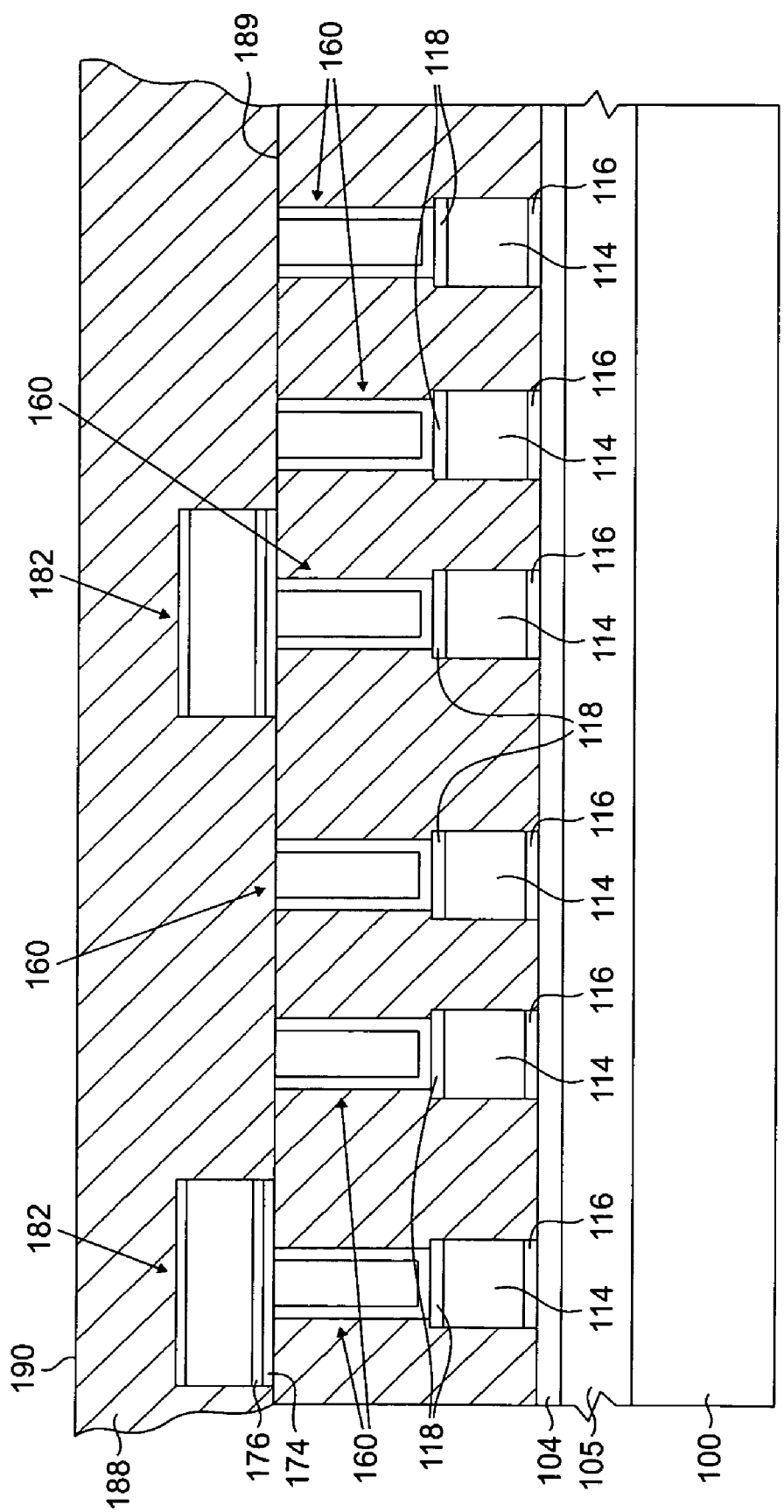

An interlayer dielectric 188, illustrated in FIG. 9, is formed over the conductive pads 182 and a field region 189 and planarized by a chemical/mechanical polishing process to form an upper surface 190.

Figure 10:
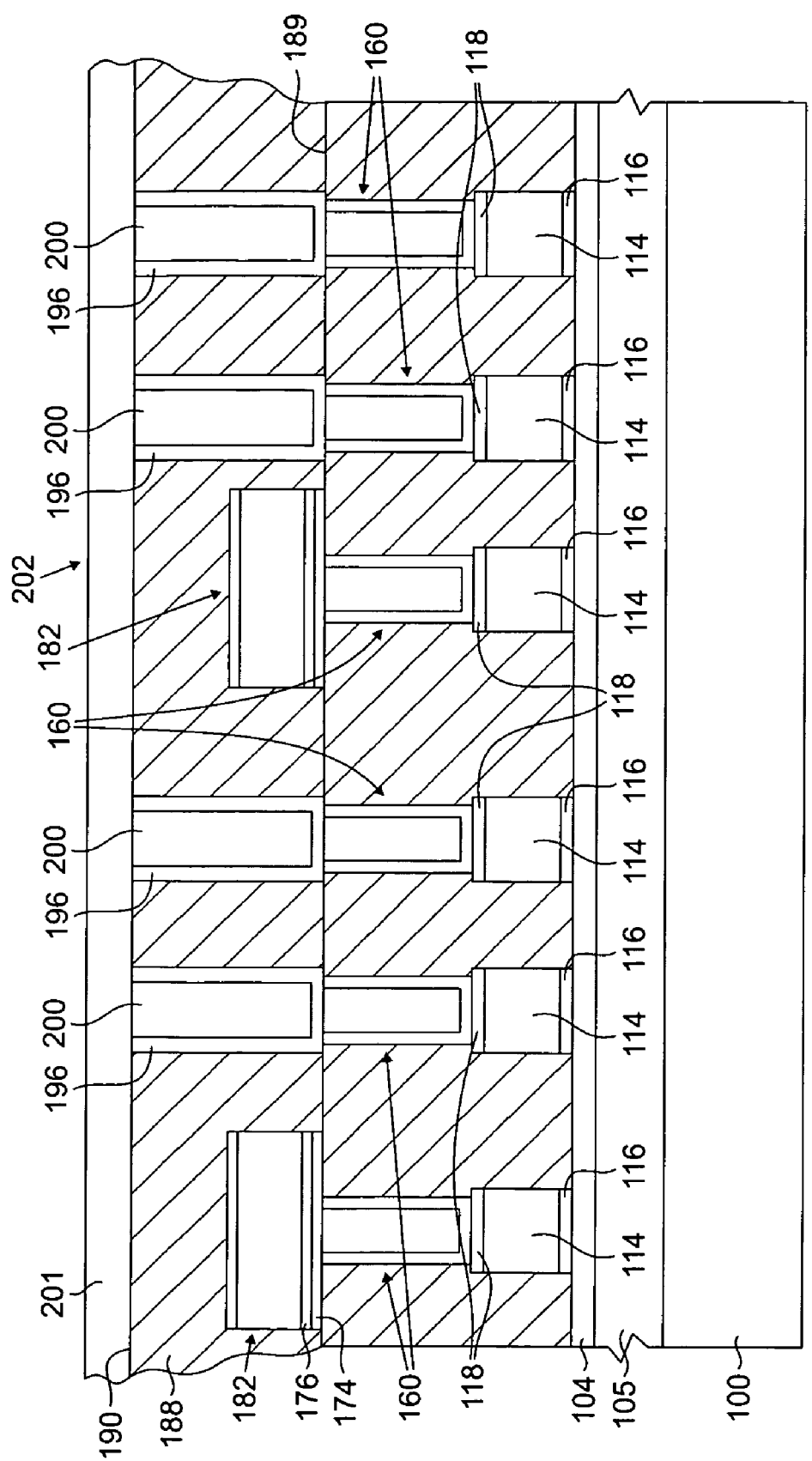

Using known photolithographic masking, patterning, and etching steps, a trench is formed in the interlayer dielectric layer 188, wherein the trench overlies the conductive line 114 and thus is generally spiral shaped. A barrier layer 196 (preferably of tantalum or tantalum nitride) and a seed layer (not shown) are formed in the trench and on the upper surface 190. See FIG. 10. An electroplating process fills the trench with copper. Next a chemical/mechanical polishing process removes copper overfill and excess barrier/seed layer material from the upper surface 190. This process forms an upper conductive runner 200 in electrical communication with the underlying conductive line 114 via the tungsten plugs 160. As is known by those skilled in the art, this layer may also be used to form copper interconnects elsewhere in the substrate (i.e., in regions other than the inductor) if necessary.

A passivation layer 201 is formed over the upper surface 190 and the conductive runner 200.

Figure 11:
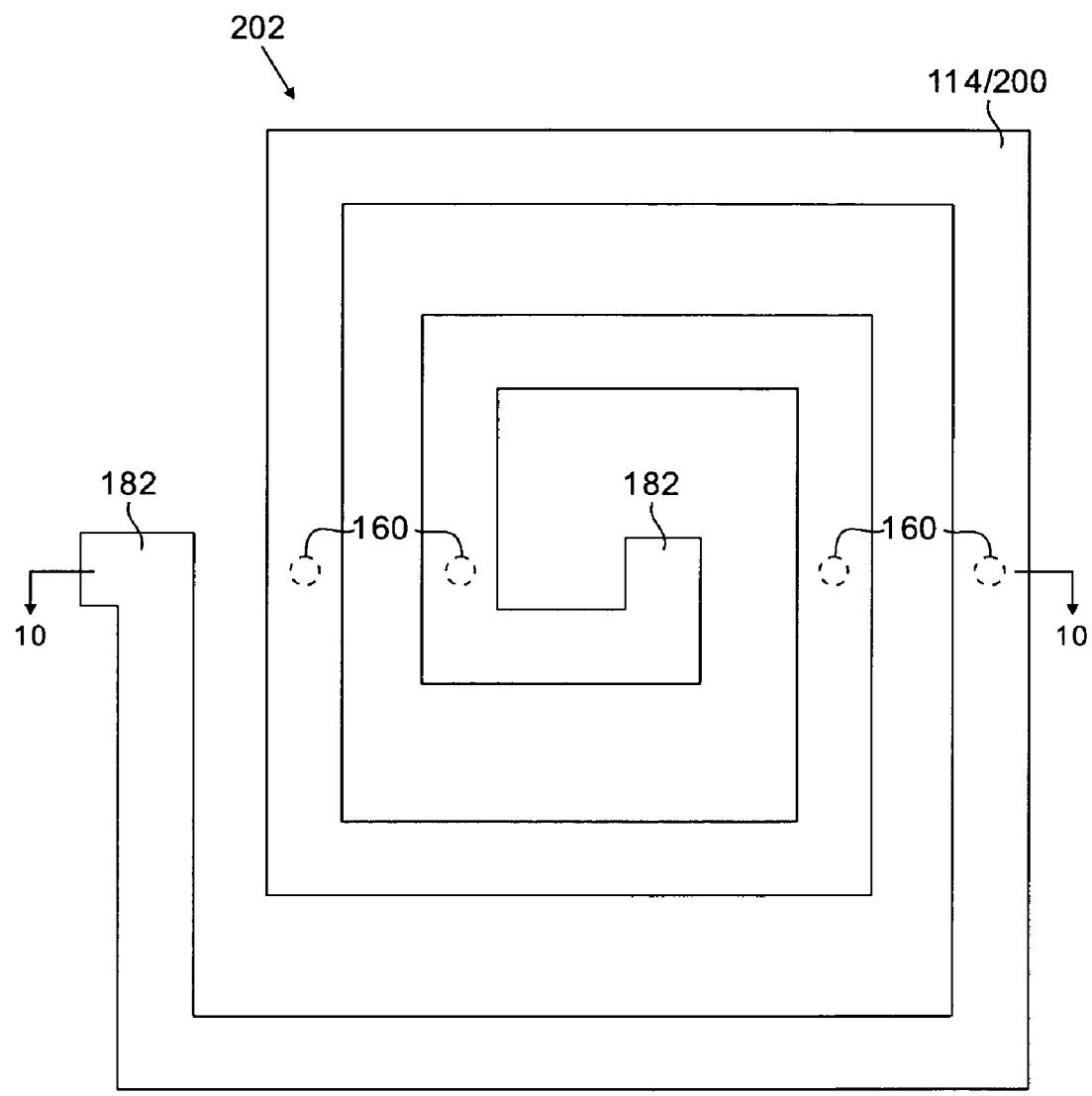

An inductor 202 comprises the conductive runner 200, the conductive line 114 and the interconnecting tungsten plugs 160. FIG. 11 is a plan view of the inductor 202, with the FIG. 10 cross-section taken along the plane 10-10. Advantageously, the inductor 202 constructed as described above offers a lower resistance (and thus a higher Q factor) due to use of copper to form an upper layer (i.e., the conductive runner 200) of the inductor 202.

Figure 12:
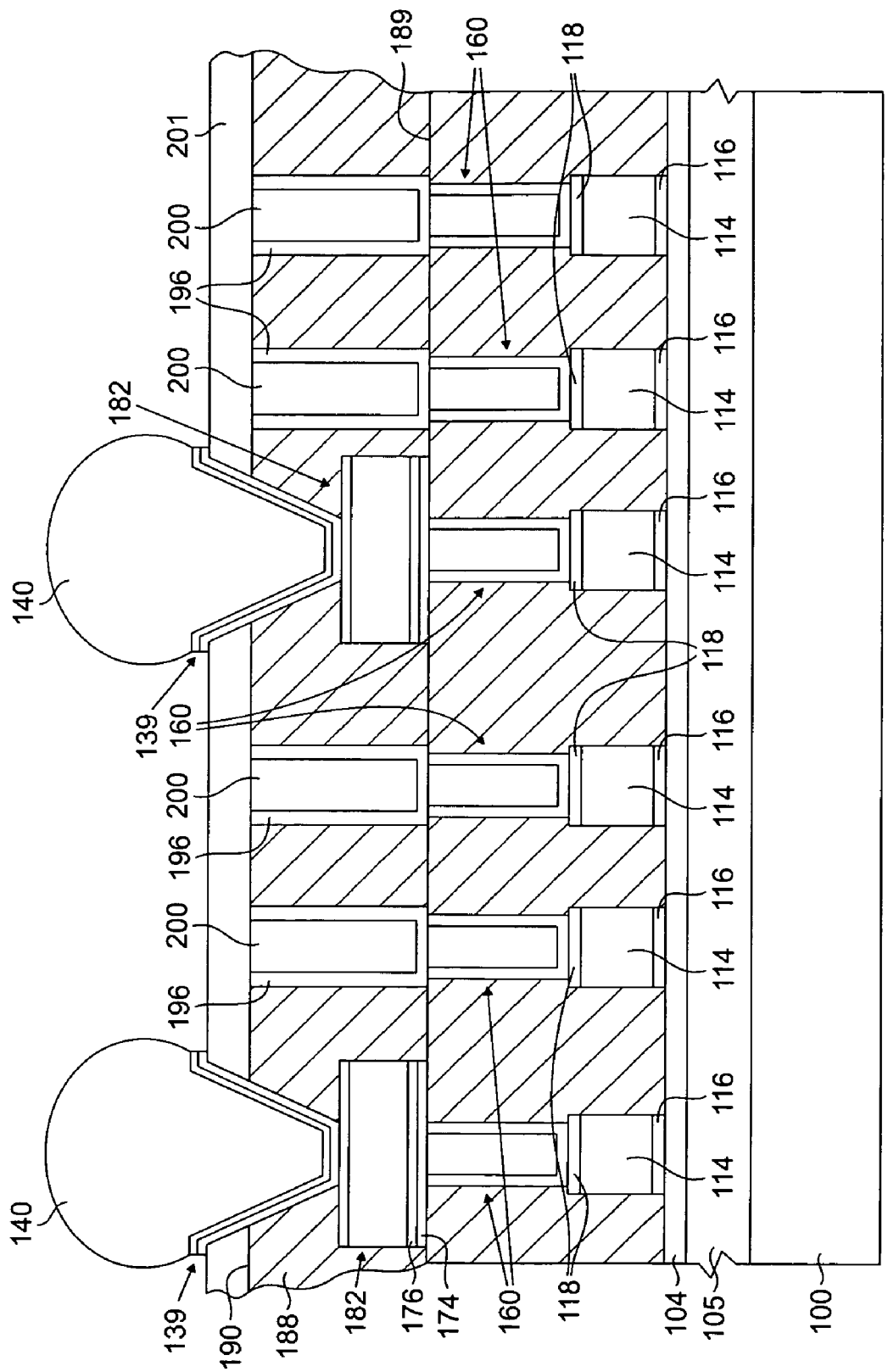

The conductive pads 182 function as inductor terminals for electrically connecting the inductor 202 to other circuit elements. Access to the conductive pads 182 is provided by forming openings overlying the pads 182 and forming the under-bump layers 139 and the solder bump 140 in each opening, such as described above in conjunction with FIGS. 5 and 6. See FIG. 12.

Preferably, as described and illustrated, the conductive runner 200 is vertically aligned with the conductive line 114, although this is not necessarily required according to the present invention. However, at least a portion of the conductive runner 200 should be vertically aligned with the conductive line 114 for accommodating interconnection via the tungsten plugs 160.

According to this exemplary embodiment, the inductor 202 is formed in two vertically adjacent metallization layers (the $n^{th}$ and $(n-1)^{th}$ layers) interconnected by the tungsten plugs 160. In another embodiment, the inductor is formed in adjacent metallization layers other than the n and $(n-1)^{th}$ layers. In yet anther embodiment, the inductor is formed in non-adjacent metallization layers interconnected by tungsten plugs.

Other embodiments of the present invention comprise differently shaped inductors, such as a zigzag or a helix formed in successive conductive layers and appropriately interconnected. Such inductors offer specific operational properties as determined from the shape and dimensions of the aluminum conductors and the conductive runners.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its scope. Therefore, it is intended that the invention not be limited to the particular embodiment disclosed as the best mode contemplated for carrying out this invention, but that the invention will include all embodiments falling within the scope of the appended claims.

What is claimed is:

1. A method for forming an inductor in a semiconductor integrated circuit, the method comprising:
   forming a conductive line in a metallization layer;
   forming a first dielectric layer overlying the conductive line;
   forming conductive structures in the first dielectric layer;
   forming a conductive pad overlying and in electrical communication with one of the conductive structures and a terminal end of the conductive line;
   forming a second dielectric layer overlying the first dielectric layer and the conductive pad;
   forming a trench in the second dielectric layer; and
   forming a conductive runner in the trench, wherein the conductive runner is in conductive communication with the conductive line through the conductive structures, and wherein the conductive line and the conductive runner cooperate to produce an inductive effect.

2. The method of claim 1 wherein forming the conductive line further comprises:
   forming a conductive layer; and
   removing regions of the conductive layer to form the conductive line.

3. The method of claim 2 wherein forming the conductive layer further comprise forming an aluminum conductive layer.

4. The method of claim I wherein forming the conductive runner in the trench further comprises depositing copper in the trench.

5. The method of claim 4 wherein depositing copper in the trench further comprises electroplating copper in the trench.

6. The method of claim 1 wherein forming the trench in the dielectric layer further comprises forming the trench in vertical alignment with the conductive line.

7. The method of claim 1 wherein forming the trench in the dielectric layer further comprises forming the trench in vertical alignment with the conductive line.

8. The method of claim 1 further comprising:
   forming an opening in the second dielectric layer extending to the conductive pad;
   forming a conductive structure in the opening, wherein the conductive structure forms an inductor terminal.

9. The method of claim 8 wherein forming the conductive structure further comprises forming a solder bump.

10. The method of claim 8 wherein forming the conductive structure further comprises forming a bond pad.

* * * * *